United States Patent
Momose

(10) Patent No.: US 8,581,578 B2
(45) Date of Patent: Nov. 12, 2013

(54) MAGNETIC PATTERN DETECTION DEVICE

(75) Inventor: Shogo Momose, Nagano (JP)

(73) Assignee: Nidec Sankyo Corporation (JP)

( * ) Notice: Subject to any disclaimer, the term of this patent is extended or adjusted under 35 U.S.C. 154(b) by 343 days.

(21) Appl. No.: 12/810,975

(22) PCT Filed: Dec. 19, 2008

(86) PCT No.: PCT/JP2008/003859
§ 371 (c)(1),
(2), (4) Date: Jun. 28, 2010

(87) PCT Pub. No.: WO2009/084174
PCT Pub. Date: Sep. 7, 2009

(65) Prior Publication Data
US 2010/0308113 A1    Dec. 9, 2010

(30) Foreign Application Priority Data

Dec. 28, 2007 (JP) ................. 2007-340031

(51) Int. Cl.
*G01R 33/12* (2006.01)
(52) U.S. Cl.
USPC ............ 324/228; 324/237; 324/238; 324/240
(58) Field of Classification Search
USPC .......................................... 324/228, 237–240
See application file for complete search history.

(56) References Cited

U.S. PATENT DOCUMENTS

| | | | | |
|---|---|---|---|---|
| 5,614,824 A | * | 3/1997 | Dames et al. | 324/239 |
| 5,959,279 A | * | 9/1999 | Komatsu | 235/449 |
| 6,297,631 B1 | * | 10/2001 | Ozue et al. | 324/210 |
| 7,474,780 B2 | * | 1/2009 | Volpa | 382/139 |
| 7,735,721 B1 | * | 6/2010 | Ma et al. | 235/379 |

FOREIGN PATENT DOCUMENTS

| | | |
|---|---|---|
| JP | 59-120857 A | 7/1984 |
| JP | 61-149858 A | 7/1986 |
| JP | 62-54389 A | 3/1987 |
| JP | 2000-099788 * | 4/2000 |
| JP | 2000-99788 A | 4/2000 |
| JP | 2002-202353 A | 7/2002 |
| JP | 2004-199459 A | 7/2004 |
| JP | 2004-199460 A | 7/2004 |
| JP | 2007-64839 A | 3/2007 |
| JP | 2007-241653 A | 9/2007 |
| JP | 2007-241654 A | 9/2007 |
| WO | 2007/026506 A1 | 3/2007 |

OTHER PUBLICATIONS

International Search Report for PCT/JP2008/003859 mailed Mar. 17, 2009 with English translation.

* cited by examiner

*Primary Examiner* — Arleen M Vazquez
*Assistant Examiner* — Alesa Allgood
(74) *Attorney, Agent, or Firm* — Cantor Colburn LLP

(57) ABSTRACT

A magnetic pattern detection device for use with a medium having at least one magnetic pattern of a plurality of types of magnetic patterns whose residual magnetic flux density and permeability are different on a basis of both of a level of residual magnetic flux density and a level of permeability may include a common sensor part structured to detect presence/absence of each of the plurality of types of magnetic patterns, and a signal processing section structured to extract a first signal corresponding to the level of the residual magnetic flux density and a second signal corresponding to the level of the permeability from a signal outputted from the sensor part.

13 Claims, 10 Drawing Sheets

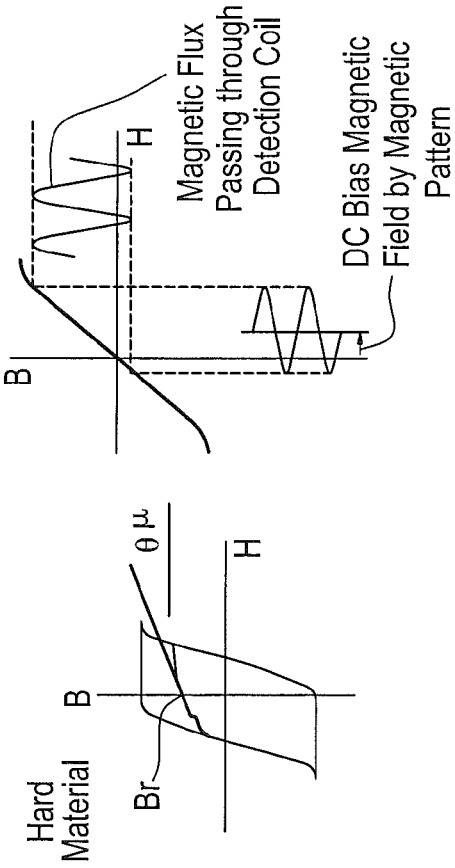

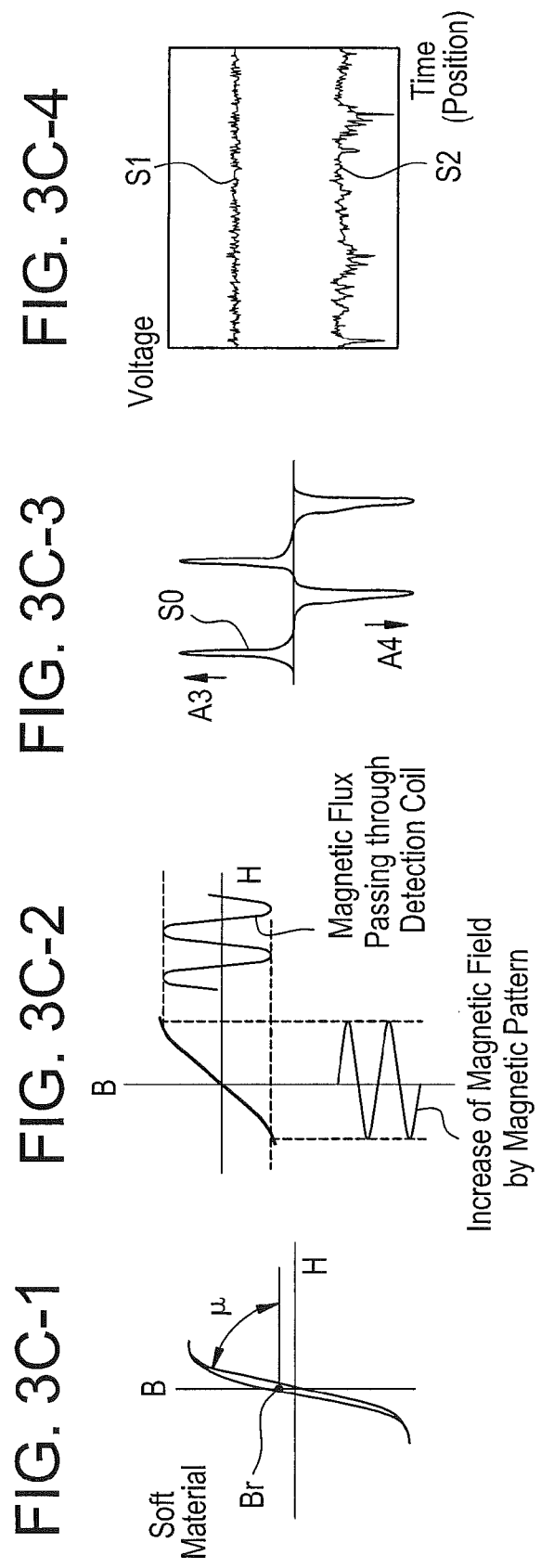

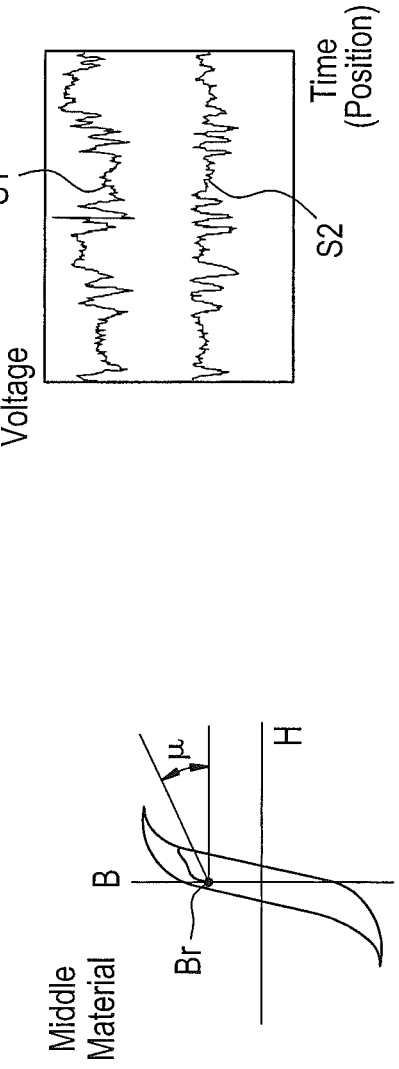

Excitation Waveform

Measurement of Permeability (Magnetic Body)

Increase or Decrease by Presence/Absence Magnetic Body

Peak Value

Variation of Permeability

Bottom Value

MAGNETIC PATTERN DETECTION DEVICE

CROSS REFERENCE TO RELATED APPLICATIONS

This is a U.S. national stage of international application No. PCT/JP2008/003859, filed on Dec. 19, 2008. Priority under 35 U.S.C. §119(a) and 35 U.S.C. §365(b) is claimed from Japanese Application No. 2007-340031, filed Dec. 28, 2007, the disclosure of which is also incorporated herein by reference.

FIELD OF THE INVENTION

At least an embodiment relates to a magnetic pattern detection device in which magnetism is detected from a medium such as a bank note and securities to perform authentication or discriminate types of the medium.

BACKGROUND

In recent years, techniques for discriminating forgery of a valuable printed member such as a bank note and securities have been required and various techniques for checking authenticity of the printed member have been proposed. As one of the techniques, a technique has been adopted in which a predetermined magnetic pattern is formed on a paper with magnetic ink and presence/absence of the magnetic pattern or its formed position is detected from the medium on which the magnetic pattern has been formed (see, for example, Japanese Patent No. 3,799,448 and Japanese Patent No. 3,814,692).

The recognition method is generally classified into three methods. In other words, the first method is a method in which presence/absence of magnetic ink and its formation position is detected through a differential transformer type sensor by utilizing a difference of permeability of a medium (magnetic ink). The second method is a method in which magnetic ink is magnetized and then its leakage flux is measured by an MR sensor, an MI sensor or a magnetic head. This method measures residual magnetic flux density of the magnetic ink. The third method is a method in which, when magnetic ink is to be magnetized with a magnet, a variation of magnetic flux of the magnet is measured with an MR sensor and this method measures permeability of the magnetic ink.

However, in paper moneys or the like, there may be cases that kinds of used magnetic inks are different for each country or for each paper money and, in this state, it is difficult that all paper moneys are discriminated by one device. Generally, magnetic ink is roughly classified into magnetic ink containing hard material and magnetic ink containing soft material. The hard material is, like magnetic material used for a magnet, magnetic material whose hysteresis is larger and residual magnetic flux density is higher and which is easily magnetized when magnetic field is applied from the outside. On the other hand, the soft material is, like core material for a motor or a magnetic head, magnetic material whose hysteresis is smaller and residual magnetic flux density is lower and which is not easily magnetized. Therefore, in the first method and the third method as described above, in magnetic types on a weak side, an output having an extremely low level is obtained and thus it is difficult to determine the type of magnetic ink. Further, even in the magnetic ink containing hard material on a strong side, since an output level is varied due to shading, an output is small in a case of a magnetic ink with a low concentration and thus, in this case, it is difficult to determine whether it is the hard material or the soft material. Therefore, in order to discriminate authenticity of a paper money or its kind with a high degree of accuracy, after it has been judged whether the magnetic ink contains hard material or soft material, discrimination is required to perform by a method suitable to the result of the judgment and thus it is difficult that all kinds of paper moneys are discriminated by one device. In the devices disclosed in the above-mentioned two Patent References, plural kinds of magnetic patterns whose residual magnetic flux densities are different from each other are detected but, even in these devices, substantially, only the residual magnetic flux density of the magnetic ink is measured.

Further, it is conceivable that a detection device measuring permeability is disposed on an upstream side of a feeding path for a paper money and another detection device measuring a residual magnetic flux density is disposed on a downstream side of the feeding path for the paper money. However, in this structure, respective errors of two detection devices affect the recognition and thus accurate discrimination is difficult. In addition, when two detection devices are provided, cost is increased by themselves and, since two mechanically stable traveling portions are required, a complicated mechanism is required and thus cost is further increased and it is not practical.

In view of the problems described above, at least an embodiment of the present invention is provides a magnetic pattern detection device which is capable of surely detecting presence/absence of the magnetic pattern and types of magnetic inks on various media with a simple structure.

SUMMARY

In order to solve the problems, at least an embodiment of the present invention provides a magnetic pattern detection device for detecting a magnetic pattern on a medium including a common sensor part for detecting presence/absence of each magnetic pattern in the medium of plural types of magnetic patterns whose residual magnetic flux density and permeability are different on the basis of both of a level of residual magnetic flux density and a level of permeability, and a signal processing section which extracts a first signal corresponding to the level of the residual magnetic flux density and a second signal corresponding to the level of the permeability from a signal outputted from the sensor part.

According to at least an embodiment of the present invention, presence/absence of each magnetic pattern in the medium of plural types of magnetic patterns whose residual magnetic flux density and permeability are different is detected on the basis of both of a level of residual magnetic flux density and a level of permeability. Therefore, kinds of the magnetic pattern can be surely discriminated and the types of the magnetic patterns can be detected. Further, the sensor part is commonly used for two types of detections and thus a time difference does not occur between measurement of a level of the residual magnetic flux density and measurement of a level of the permeability. Therefore, the signal processing section is capable of detecting with a high degree of accuracy with a simple structure. Further, even when measurement is performed while the sensor part and a medium are relatively moved, a feeding mechanism can be simplified.

In at least an embodiment of the present invention, it is preferable that a feeding means is provided for relatively moving the sensor part with respect to the medium. According to this structure, the magnetic pattern on the medium can be continuously detected. In this case, it is preferable that the signal processing section detects the presence/absence and a formed position of the plural types of the magnetic patterns in the medium on the basis of the first signal, the second signal and relative positional information between the medium and the sensor part. According to this structure, the formed position in the moving direction of the magnetic pattern can be detected by means of that the presence/absence of the magnetic pattern on the medium is detected while the sensor part and the medium are relatively moved to each other.

In at least an embodiment of the present invention, it may be structured that the sensor part includes a magnetic field application part which applies a magnetic field to the medium, and a magnetic flux detecting part which detects magnetic flux in a state where a bias magnetic field is applied to the medium after the magnetic field by the magnetic field application part has been applied. In this case, the size of the magnetic pattern detection device can be reduced.

In at least an embodiment of the present invention, it may be structured that the magnetic flux detecting part includes a magnetic sensor element having a sensor core, a bias exciting coil for generating a bias magnetic field which is wound around the sensor core, and a detection coil which is wound around the sensor core.

In at least an embodiment of the present invention, it is preferable that the magnetic sensor element includes a differential exciting coil for generating a differential magnetic field which is wound around the sensor core in a reverse direction to the bias exciting coil for generating the bias magnetic field. According to this structure, the magnetic sensor element is structured in a magnetically differential manner and thus a measurement error due to environment can be eliminated.

In at least an embodiment of the present invention, it is preferable that the bias exciting coil for generating the bias magnetic field is generated with an alternating magnetic field. In this case, it may be structured that the signal processing section includes an adding circuit in which a peak value and a bottom value of a signal outputted from the magnetic sensor element are added to extract a first signal that corresponds to a level of residual magnetic flux density of the magnetic pattern, and a subtracting circuit in which the peak value and the bottom value are subtracted to extract a second signal that corresponds to a level of permeability of the magnetic pattern.

In at least an embodiment of the present invention, it is preferable that the sensor core is provided with a body part, around which the detection coil is wound, and a protruded part which is protruded from the body part toward a side where the medium is passed, and the bias exciting coil for generating bias magnetic field is wound around the protruded part. According to this structure, the bias magnetic field is generated toward a medium efficiently. Further, the bias exciting coil for generating bias magnetic field can be disposed closer to the medium. Therefore, sensitivity can be improved.

In at least an embodiment of the present invention, it is preferable that a cross-sectional area of the protruded part is smaller than a cross-sectional area of the body part. According to this structure, since magnetic efficiency is enhanced, sensor sensitivity can be improved.

In at least an embodiment of the present invention, it is preferable that the sensor core is formed in a thin plate shape. According to this structure, a narrow range on a medium may be set as a portion to be detected and thus the magnetic pattern detection device is capable of sufficiently coping with a minute magnetic pattern. Further, in a case that the sensor core is to be saturated, when its cross-sectional area is smaller, a consumption current is reduced.

In at least an embodiment of the present invention, it is preferable that both faces of the magnetic sensor element are covered with nonmagnetic members. According to this structure, even when the magnetic sensor element is thinly structured, for example, abrasion due to sliding with a medium is reduced and the magnetic sensor element is reinforced.

At least an embodiment of a magnetic pattern detection device is used for discriminating a magnetic pattern of at least one of a first medium where one of plural types of magnetic patterns is formed and a second medium where plural types of magnetic patterns are formed.

In the at least an embodiment of present invention, the magnetic pattern is printed by using magnetic ink, for example, magnetic ink containing hard material such as steel or hard ferrite (hard magnetic material) and/or magnetic ink containing soft material such as silicon-steel or soft ferrite (soft magnetic material). According to at least an embodiment of the present invention, even when the magnetic pattern formed on a medium becomes to be complicated from a standpoint of security, one magnetic pattern detection device is capable of coping with the magnetic pattern.

In at least an embodiment of the present invention, it is preferable that the sensor part is disposed at plural positions in a direction intersecting with a feeding direction of the medium. According to this structure, presence/absence of a magnetic pattern in a widthwise direction of a carried medium can be detected and its formed position in the widthwise direction can be detected.

In at least an embodiment of the present invention, presence/absence of each magnetic pattern in the medium of plural types of magnetic patterns whose residual magnetic flux density and permeability are different is detected on the basis of both of a level of residual magnetic flux density and a level of permeability. Therefore, the kind of the magnetic pattern can be surely discriminated and the types of the magnetic patterns can be detected. Further, the sensor part is commonly used for two types of detections and thus a time difference does not occur between measurement of a level of the residual magnetic flux density and measurement of a level of the permeability. Therefore, the signal processing section is capable of detecting with a high degree of accuracy with a simple structure. Further, even when measurement is performed while the sensor part and a medium are relatively moved, a feeding mechanism can be simplified.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIGS. 5(*a*1), 5(*a*2), 5(*b*1) and 5(*b*2) are explanatory views showing principles in which presence/absence of a magnetic pattern on a medium where different types of magnetic patterns are formed is detected in a magnetic pattern detection device in accordance with an embodiment of the present invention.

DETAILED DESCRIPTION OF PREFERRED EMBODIMENTS

Embodiments of the present invention will be described below with reference to the accompanying drawings.
(Entire Structure)

Figure 1:
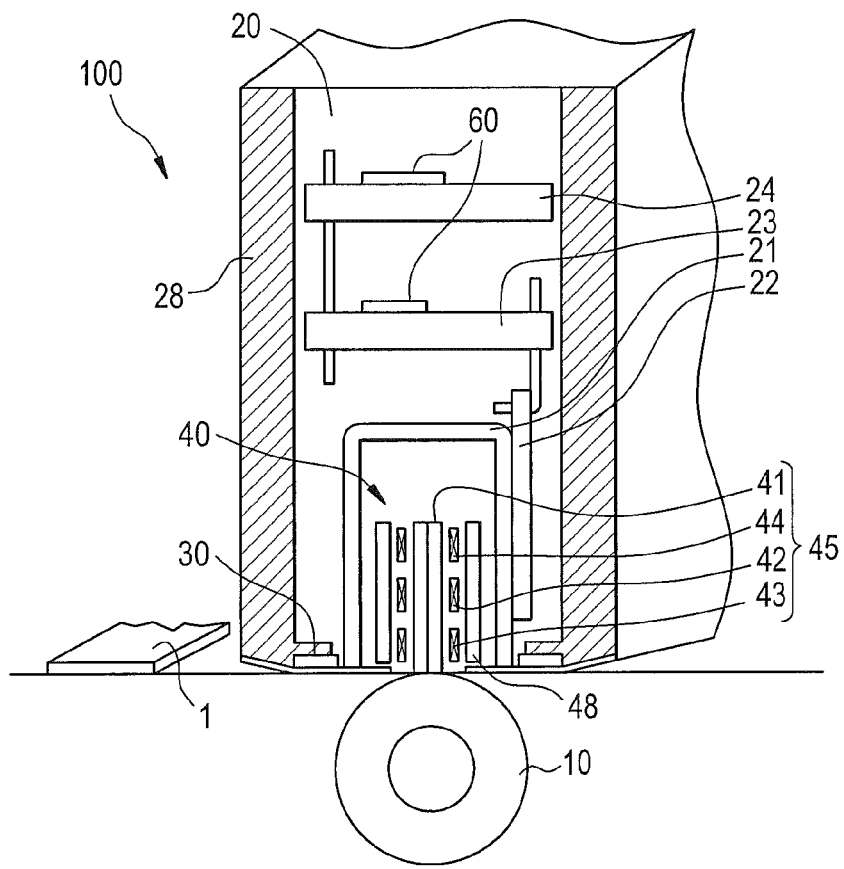
FIG. 1 is an explanatory view showing an essential part of a magnetic pattern detection device in accordance with an embodiment of the present invention.
Figure 2:
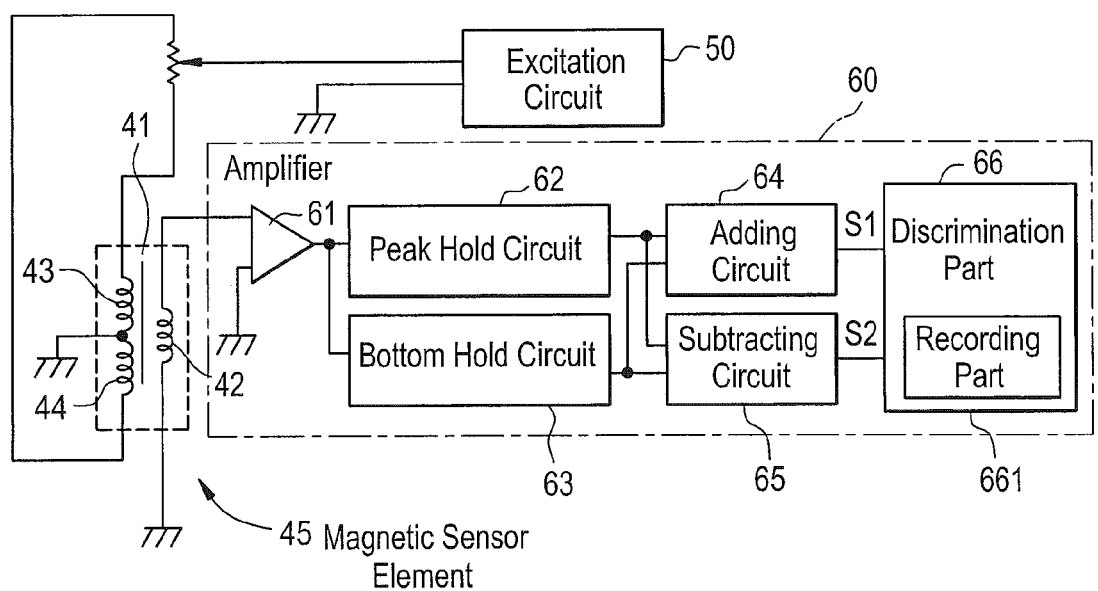
FIG. 2 is a block diagram showing a magnetic pattern detection device in accordance with an embodiment of the present invention.
Figures 2, 3A:
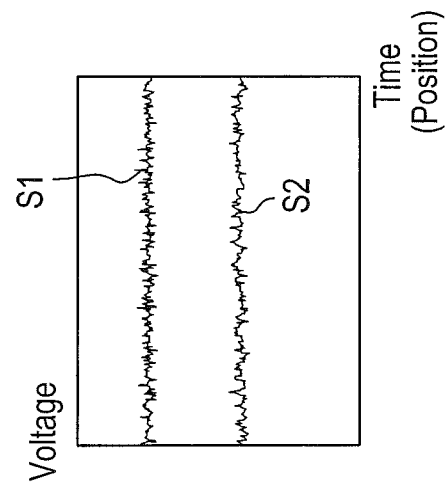
Figures 3, 3A:
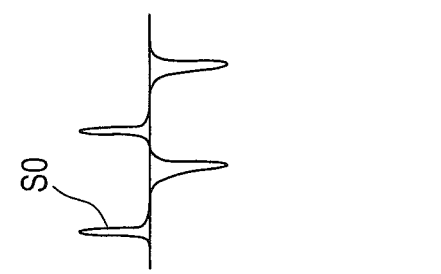
FIGS. 3(*a*2) through 3(*a*4), 3(*b*1) through 3(*b*4), 3(*c*1) through 3(*c*4), and 3(*d*1) and 3(*d*4) are explanatory views showing principles of a magnetic pattern detection device in accordance with an embodiment of the present invention.
Figures 3, 3A, 4:
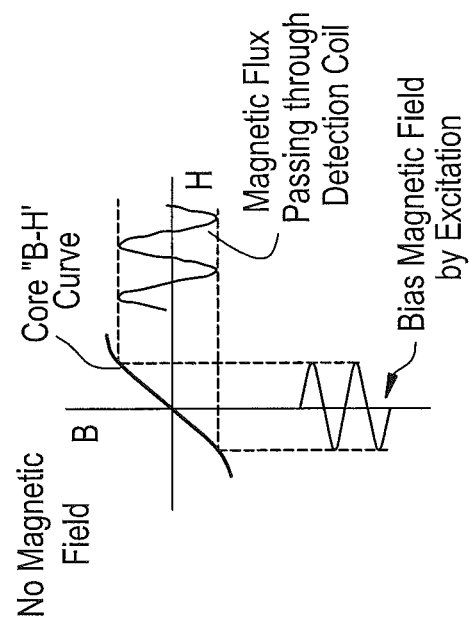
FIG. 4(*a*) is a front view showing a magnetic sensor element which structures a magnetic flux detecting part in a magnetic pattern detection device in accordance with an embodiment of the present invention, FIG. 4(*b*) is an explanatory view showing an excitation waveform to the magnetic sensor element, FIG. 4(*c*) is an explanatory view showing an output signal from the magnetic sensor element, and FIG. 4(*d*) is a front view showing another magnetic sensor element.

FIG. 1 is an explanatory view showing an essential part of a magnetic pattern detection device in accordance with an embodiment of the present invention and FIG. 2 is its block diagram. FIGS. 3(a2) through 3(a4), 3(b1) through 3(b4), 3(c1) through 3(c4), and 3(d1) and 3(d4) are explanatory views showing principles of a magnetic pattern detection device in accordance with an embodiment of the present invention.

A magnetic pattern detection device 100 shown in FIG. 1 is a device in which magnetism is detected from a medium 1 such as a bank note or securities to discriminate authenticity or its type. The magnetic pattern detection device 100 includes a feeding device 10 for carrying a sheet-shaped medium 1 by a roller and a guide (not shown), a sensor part 20 for detecting magnetism from the medium 1 at a midway position in a medium feeding path through the feeding device 10, and a signal processing section 60 which will be described below with reference to FIG. 2. In this embodiment, the roller and the guide are structured of nonmagnetic material such as aluminum. The sensor part 20 is disposed on an upper side of the medium feeding path but, alternatively, the sensor part 20 may be disposed on an under side of the medium feeding path. In each case, the sensor part 20 is disposed so that its detection face is directed to the medium feeding path.

In this embodiment, the medium 1 is formed with plural types of magnetic patterns 2 whose residual magnetic flux density "Br" and permeability "μ" are different from each other. For example, the medium 1 is formed with a first magnetic pattern which is printed with magnetic ink containing hard material and a second magnetic pattern which is printed with magnetic ink containing soft material. In this embodiment, as shown by the residual magnetic flux density "Br" and permeability "μ" through the hysteresis loop in FIG. 3(b1), a level of residual magnetic flux density "Br" of the magnetic ink containing hard material is higher when magnetic field is applied but its permeability "μ" is lower. On the contrary, as shown by the hysteresis loop in FIG. 3(c1), a level of residual magnetic flux density "Br" of the magnetic ink containing soft material is lower when magnetic field is applied but its permeability "μ" is higher.

Therefore, in this embodiment, the sensor part 20 detects presence/absence of every magnetic pattern 2 in the medium 1 on the basis of both of a level of residual magnetic flux density and a level of permeability. In this embodiment, the sensor part 20 for detecting two types of the magnetism patterns 2 is commonly used.

Therefore, the signal processing section 60 shown in FIG. 2 extracts a first signal "S1" corresponding to a level of residual magnetic flux density and a second signal "S2" corresponding to a level of permeability from a signal outputted from the sensor part 20 and, on the basis of the extracted results of the signals and relative positional information between the medium 1 and the sensor part 20, presence/absence of plural types of magnetic patterns and formed position of the magnetic patterns in the medium 1 are detected. More specifically, the signal processing section 60 includes an amplifier 61 which amplifies a signal outputted from the sensor part 20, a peak hold circuit 62 and a bottom hold circuit 63 which hold a peak value and a bottom value of a signal outputted from the amplifier 61, an adding circuit 64 where the peak value and the bottom value are added to each other to extract a first signal "S1", and a subtracting circuit 65 where the peak value and the bottom value are subtracted from each other to extract a second signal "S2". In addition, the signal processing section 60 also includes a discrimination part 66 which collates respective signals outputted from the adding circuit 64 and the subtracting circuit 65 with comparison patterns previously recorded in a recording part 661 in association with relative positional information between the sensor part 20 and the medium 1 to discriminate its authenticity of the medium 1. The discrimination part 66 is structured of a microcomputer or the like. The discrimination part 66 executes a predetermined operation on the basis of a program previously recorded in a recording part (not shown) such as a ROM or a RAM to discriminate authenticity of the medium 1.

Further, in FIG. 1, the sensor part 20 is disposed at plural positions in a direction intersecting the feeding direction of the medium 1, and the plural sensor parts 20 are disposed within individual covers or, alternatively, disposed within a common cover 28. The sensor part 20 includes a magnetic field application part 30 which applies magnetic field to the medium 1, and a magnetic flux detecting part 40 which detects magnetic flux of the medium 1 in a state that a bias magnetic field is applied after the magnetic field by the magnetic field application part 30 has been applied.

The magnetic field application part 30 is structured of a permanent magnet such as a ferrite or a neodymium magnet and is held on an under face of the cover 28. The magnetic flux detecting part 40 includes a thin plate-shaped magnetic sensor element 45 and is disposed so that its thickness direction is directed in the feeding direction of the medium 1. Both faces of the magnetic sensor element 45 are covered by a thin plate-shaped nonmagnetic member 48 which is made of ceramic or the like and whose thickness is about 0.3 mm-1 mm. In this state, the magnetic sensor element 45 is accommodated within a magnetic shield case 21. An under side of the magnetic shield case 21 where the medium feeding path is located is opened and the magnetic sensor element 45 is disposed in an exposed state toward the medium feeding path. The magnetic shield case 21 is also utilized as a support body for a circuit board 22 and the circuit board 22 is disposed on a side face of the magnetic shield case 21. Further, a plurality of circuit boards 23 and 24 are also held within the cover 28. The circuit boards 22, 23 and 24 are electrically connected with each other and the signal processing section 60 shown in FIG. 2 is structured on the circuit boards 23 and 24.
(Detail Structure of Sensor Part 20)

Figure 4A:
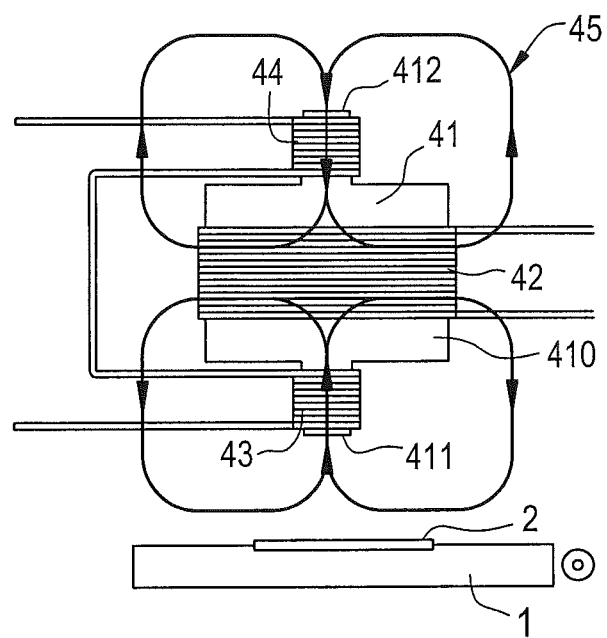
Figure 4B:
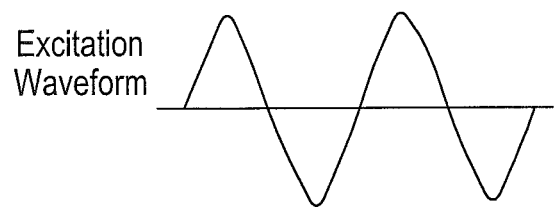
Figure 4C:
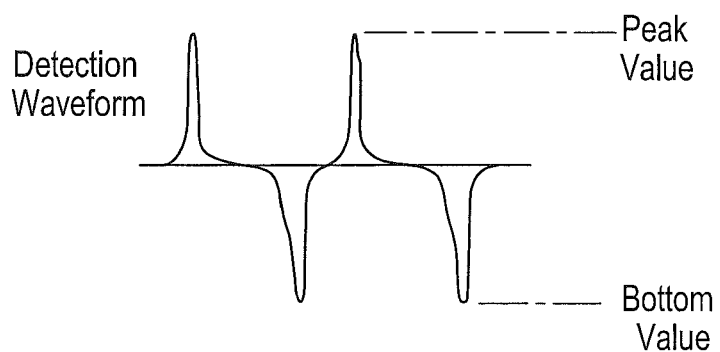
Figure 4D:
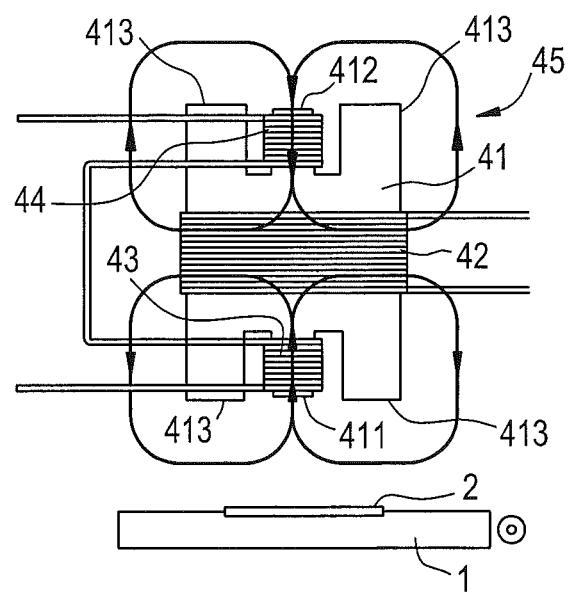
Figures 1, 5A:
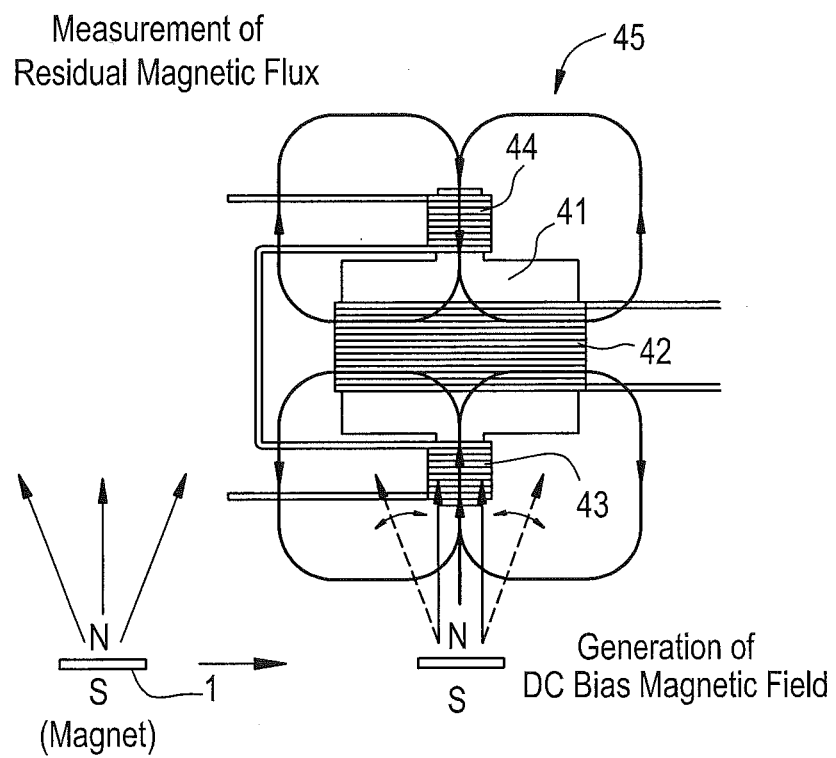
Figures 2, 5A:
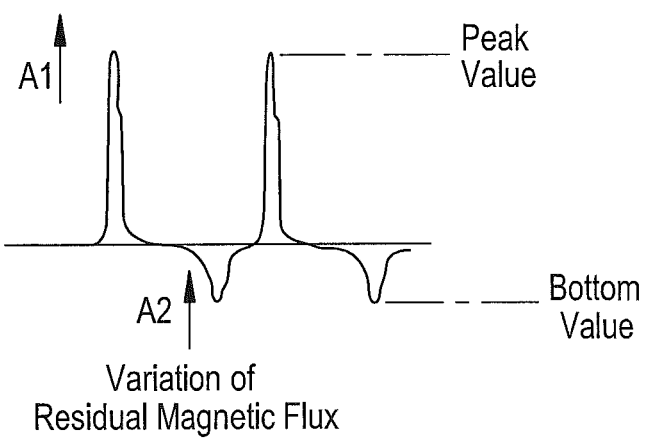
Figures 1, 5B:
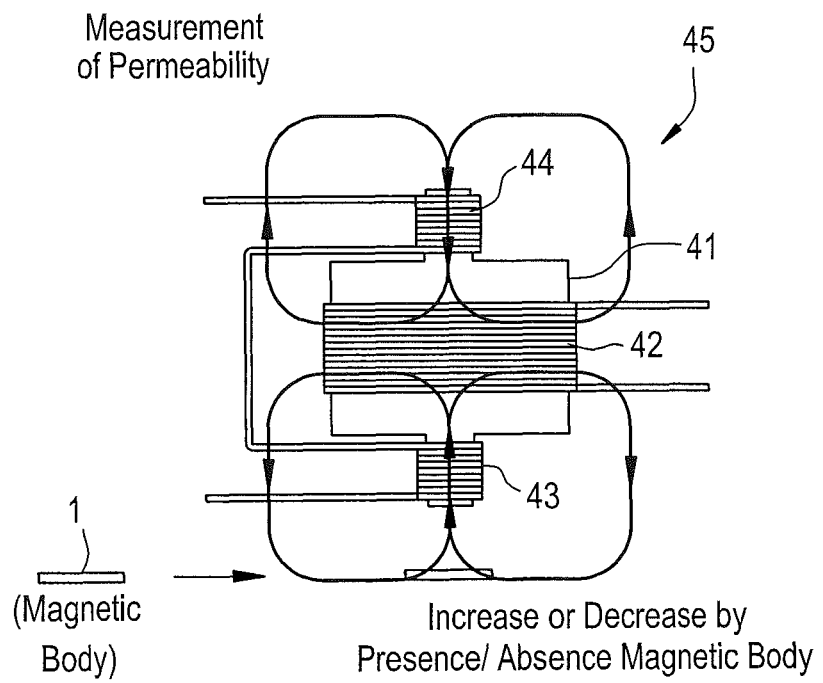
Figures 2, 5B:
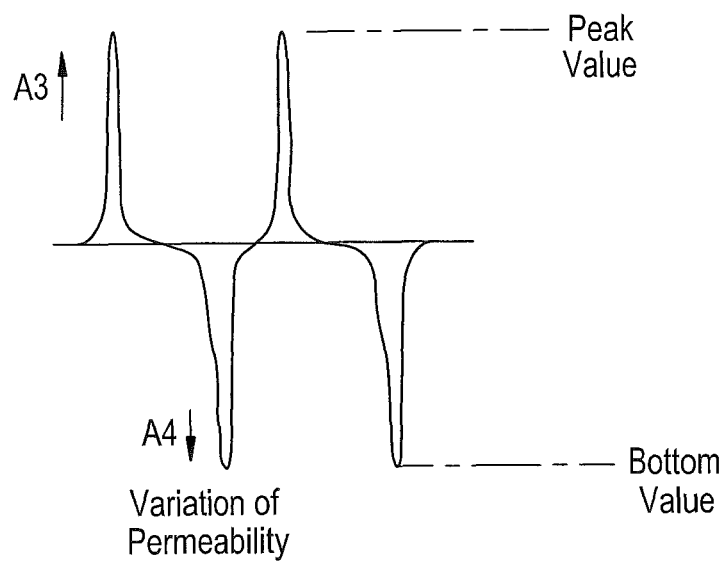

FIG. 4(a) is a front view showing the magnetic sensor element 45 which structures a magnetic flux detecting part in the magnetic pattern detection device 100 in accordance with an embodiment of the present invention, FIG. 4(b) is an explanatory view showing an excitation waveform to the magnetic sensor element 45, FIG. 4(c) is an explanatory view showing an output signal from the magnetic sensor element 45, and FIG. 4(d) is a front view showing another magnetic sensor element 45. FIGS. 5(a1), 5(a2), 5(b1) and 5(b2) are explanatory views showing principles in which presence/absence of a magnetic pattern 2 on a medium 1 where different types of magnetic patterns 2 are formed is detected in a magnetic pattern detection device 100 in accordance with an embodiment of the present invention. FIG. 4(a) shows a state where the medium 1 is moved in a direction perpendicular to the drawing.

As shown in FIG. 4(a), the magnetic sensor element 45 which is used as the magnetic flux detecting part 40 in the sensor part 20 includes a thin plate-shaped sensor core 41 made of amorphous or permalloy, a bias exciting coil 43 for generating bias magnetic field which is wound around the sensor core 41, and a detection coil 42 which is wound around the sensor core 41. In addition, the magnetic sensor element 45 includes a differential exciting coil 44 for generating differential magnetic field which is wound around the sensor core 41 in a reverse direction to the bias exciting coil 43 for generating bias magnetic field.

As shown in FIG. 2, the bias exciting coil 43 for generating bias magnetic field and the differential exciting coil 44 for generating differential magnetic field are serially-connected with each other and the middle point is held at a ground potential. Further, an alternating current (see FIG. 4(b)) having the same phase is applied from the excitation circuit 50 with a constant current to the bias exciting coil 43 for generating bias magnetic field and the differential exciting coil 44 for generating differential magnetic field. Therefore, as shown in FIG. 4(a), a bias magnetic field and a magnetic field for differential whose direction is reverse to the bias magnetic field are formed around the sensor core 41, and a signal having a detection waveform shown in FIG. 4(c) is outputted from the detection coil 42. In this embodiment, the detection waveform shown in FIG. 4(c) is a differential signal with respect to the bias magnetic field and time and, in addition, the signal is a signal which is based on a magnetic differential with the magnetic field for differential formed by the differential exciting coil 44 for generating differential magnetic field.

In FIG. 4(a), the sensor core 41 is provided with a body part 410 around which the detection coil 42 is wound, a first protruded part 411 which is protruded from a center portion of a lower end part of the body part 410 toward an under side where the medium 1 is passed, and a second protruded part 412 which is protruded toward an upper side from a center portion of an upper end part of the body part 410 that is an opposite side to the first protruded part 411. The detection coil 42 is wound around the body part 410 of sensor core 41, the bias exciting coil 43 for generating bias magnetic field is wound around the first protruded part 411, and the differential exciting coil 44 for generating differential magnetic field is wound around the second protruded part 412. In this embodiment, the cross-sectional areas of the first protruded part 411 and the second protruded part 412 are smaller than the cross-sectional area of the body part 410. Therefore, the detection coil 42 is structured so that its cross-sectional area is larger than the cross-sectional areas of the bias exciting coil 43 for generating bias magnetic field and the differential exciting coil 44 for generating differential magnetic field.

(Principle of Detection)

In the sensor part 20 structured as described above, when a medium 1 is to be passed through the magnetic field application part 30, a magnetic field is applied from the magnetic field application part 30 and then, the medium 1 after the magnetic field by the magnetic field application part 30 has been applied is passed through the magnetic flux detecting part 40. Until the medium 1 is passed through the magnetic flux detecting part 40, as shown in FIG. 3(a3), a signal corresponding to a "B-H" curve of the sensor core 41 shown in FIG. 3(a2) is outputted from the detection coil 42. Therefore, signals which are outputted from the adding circuit 64 and the subtracting circuit 65 shown in FIG. 2 are respectively shown in FIG. 3(a4).

When the first magnetic pattern is formed on the medium 1 with magnetic ink containing hard material such as ferrite powder, the first magnetic pattern is provided with a high level of residual magnetic flux density "Br" as shown in FIG. 3(b1). Therefore, as shown in FIG. 5(a1), when the medium 1 has been passed through the magnetic field application part 30, the first magnetic pattern is magnetized to be a magnet by the magnetic field from the magnetic field application part 30. Therefore, a DC bias is applied from the first magnetic pattern as shown in FIG. 3(b2) and the signal outputted from the detection coil 42 is varied in a waveform shown in FIG. 3(b3) and FIG. 5(a2). In other words, the peak voltage and the bottom voltage of the signal "S0" are, as shown in the arrows "A1" and "A2", shifted in the same direction and a shift amount of the peak voltage and a shift amount of the bottom voltage are different from each other. In addition, the signal "S0" is varied with movement of the medium 1. Therefore, the first signal "S1" outputted from the adding circuit 64 in FIG. 2 is varied as shown in FIG. 3(b4) and varied whenever the first magnetic pattern of the medium 1 has been passed through the magnetic flux detecting part 40. In this embodiment, since the permeability "μ" of the first magnetic pattern formed with the magnetic ink containing hard material is lower, it may be regarded that only the residual magnetic flux density "Br" of the first magnetic pattern affects the shift of the peak voltage and the bottom voltage of the signal "S0". Therefore, the second signal "S2" outputted from the subtracting circuit 65 shown in FIG. 2 does not vary even when the first magnetic pattern of the medium 1 has been passed through the magnetic flux detecting part 40 and thus the second signal "S2" is shown as FIG. 3(b4).

On the other hand, when the second magnetic pattern is formed on the medium 1 with magnetic ink containing soft material such as soft magnetic stainless steel powder, as shown in FIG. 3(c1), the hysteresis loop of the second magnetic pattern is illustrated in an inner side of the hysteresis curve of the first magnetic pattern formed with the magnetic ink containing hard material shown in FIG. 3(b1) and thus a level of the residual magnetic flux density "Br" is lower. Therefore, after the medium 1 has been passed through the magnetic field application part 30, a level of the residual magnetic flux density "Br" of the second magnetic pattern is lower. However, since the permeability "μ" of the second magnetic pattern is higher, the second magnetic pattern functions as a magnetic body. Therefore, a signal outputted from the detection coil 42 is varied like a waveform shown in FIG. 3(c3) and FIG. 5(b2) because the permeability "μ" is higher by the existence of the second magnetic pattern as shown in FIG. 3(c2). In other words, the peak voltage of the signal "S0" is shifted toward a higher side as shown by the arrow "A3" and its bottom voltage is shifted toward a lower side as shown by the arrow "A4". In this case, absolute values of the shift amount of the peak voltage and the shift amount of the bottom voltage are approximately equal to each other. Moreover, the signal "S0" is varied with movement of the medium 1. Therefore, the second signal "S2" outputted from the subtracting circuit 65 in FIG. 2 is varied as shown in FIG. 3(c4) and varied whenever the second magnetic pattern of the medium 1 is passed through the magnetic flux detecting part 40. In this embodiment, since the residual magnetic flux density "Br" of the second magnetic pattern formed with the magnetic ink containing soft material is lower, it may be regarded that only the permeability "μ" of the second magnetic pattern affects the shift of the peak voltage and the bottom voltage of the signal. Therefore, the first signal "S1" outputted from the adding circuit 64 shown in FIG. 2 does not vary even when the second magnetic pattern of the medium 1 has been passed through the magnetic flux detecting part 40 and thus the first signal "S1" is shown as FIG. 3(c4).

(Principal Effects in this Embodiment)

Figure 6A:
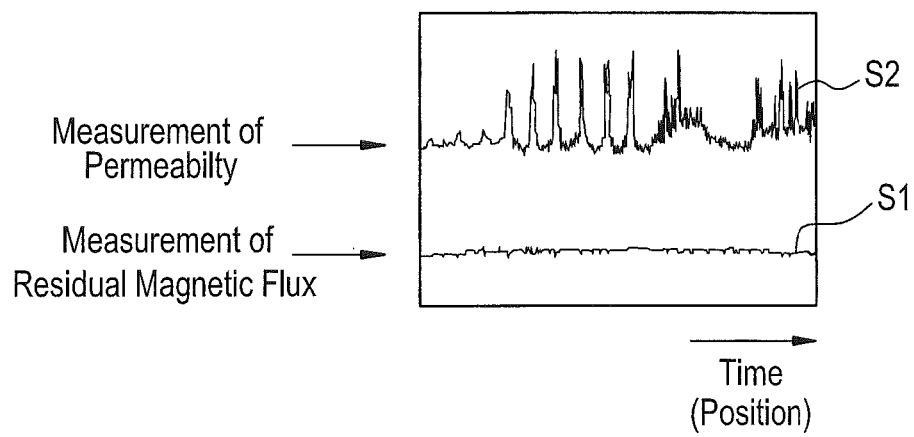
FIGS. 6(a) through 6(c) are explanatory views showing results of magnetic patterns detected from different types of media by using a magnetic pattern detection device in accordance with an embodiment of the present invention.
Figure 6B:
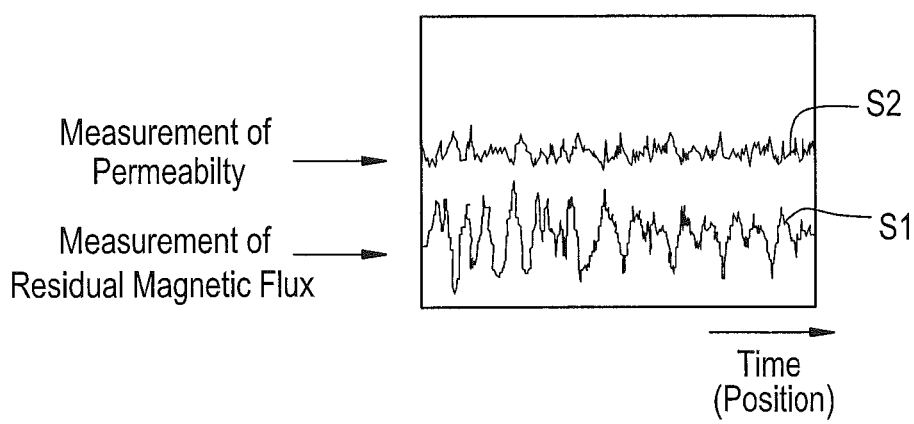
Figure 6C:
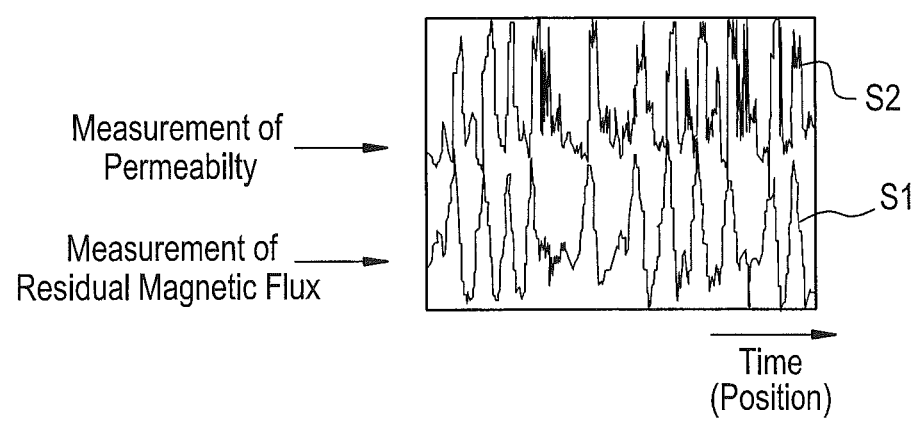

FIGS. 6(a) through 6(c) are explanatory views showing results of magnetic patterns detected from different types of media 1 by using the magnetic pattern detection device 100 in accordance with an embodiment of the present invention.

As described above, in the magnetic pattern detection device 100 in this embodiment, the first signal "S1" which is obtained by means of that the peak value and the bottom value of a signal outputted from the magnetic sensor element 45 are added in the adding circuit 64 is a signal corresponding to a level of the residual magnetic flux density of the magnetic pattern 2. Therefore, the presence/absence and the formed position of the first magnetic pattern which is formed with magnetic ink containing hard material are detected by monitoring the first signal "S1". Further, the second signal "S2" which is obtained by means of that the peak value and the bottom value of a signal outputted from the magnetic sensor element 45 are subtracted in the subtracting circuit 65 is a signal corresponding to the permeability "μ" of the magnetic pattern 2. Therefore, the presence/absence and the formed position of the second magnetic pattern which is formed with magnetic ink containing soft material are detected by monitoring the second signal "S2". Accordingly, the presence/absence and the formed position of each of the magnetic patterns 2 in media 1 having plural types of magnetic pattern whose residual magnetic flux density "Br" and permeability "μ" are different when magnetic field is applied are discriminated on the basis of both of the level of residual magnetic flux density and the level of permeability.

Accordingly, when a medium 1 on which the first magnetic pattern is formed with magnetic ink containing hard material is checked and, when a medium 1 on which the second magnetic pattern is formed with magnetic ink containing soft material is checked, the results shown in FIGS. 6(a) and 6(b) are obtained and thus, the presence/absence, the type and the formed position and, in addition, shading of the magnetic pattern 2 can be detected by collating the signal pattern and the authenticity of the medium 1 can be discriminated. Further, when two media 1 on which both of the first magnetic pattern and the second magnetic pattern are formed are checked, the result shown in FIG. 6(c) is obtained. Therefore, when the signal pattern is collated, the presence/absence, the type and the formed position and, in addition, shading of the magnetic pattern 2 can be detected and the authenticity of the medium 1 can be also discriminated.

Further, in this embodiment, the presence/absence and the formed position of each magnetic pattern 2 are detected by the common sensor part 20 on the basis of both of the level of residual magnetic flux density and the level of permeability and thus a time difference does not occur between measurement of the level of residual magnetic flux density and measurement of the level of permeability. Therefore, even when measurement is performed while the sensor part 20 and the medium 1 are moved, the signal processing section 60 is capable of performing detection with a high degree of accuracy with a simple structure. Further, only a portion of the feeding device 10 for passing through the sensor part 20 requires traveling stability and thus the structure can be simplified.

In addition, according to the magnetic pattern detection device 100 in this embodiment, detection of the magnetic pattern 2 can be performed for a medium 1 on which the magnetic pattern 2 is formed with magnetic ink containing both of hard material and soft material and, in addition, for a medium 1 on which the magnetic pattern 2 is formed with magnetic ink containing material corresponding to the middle material between hard material and soft material. In other words, in a magnetic pattern 2 whose magnetic properties correspond to the middle of the first magnetic pattern and the second magnetic pattern, as shown in FIG. 3(d1), the hysteresis loop corresponds to a middle shape between the hysteresis loop of the magnetic pattern containing hard material shown in FIG. 3(b1) and the hysteresis loop of the magnetic pattern containing soft material shown in FIG. 3(c1) and thus a signal pattern shown in FIG. 3(d4) is obtained. Therefore, the presence/absence and the formed position of the magnetic pattern 2 can be also detected.

Further, in this embodiment, the magnetic sensor element 45 is provided with the bias exciting coil 43 for generating bias magnetic field and the differential exciting coil 44 for generating differential magnetic field so as to be structured in a magnetically differential state. Therefore, a measurement error due to environment can be eliminated and the signal is easily processed. In addition, the bias exciting coil 43 for generating bias magnetic field and the differential exciting coil 44 for generating differential magnetic field are wound around the first protruded part 411 and the second protruded part 412 which are protruded from the body part 410 of the sensor core 41. Therefore, the bias magnetic field can be efficiently generated toward the medium 1 and, since the sensor core 41 can be disposed closer to the medium 1, sensitivity is improved. Moreover, the cross-sectional areas of the first protruded part 411 and the second protruded part 412 are smaller than the cross-sectional area of the body part 410 and thus sensitivity is higher because the magnetic circuit is highly efficient.

In addition, since the sensor core 41 is formed in a thin plate shape, a narrow range on the medium 1 can be set as a portion to be detected and thus the sensor core 41 is capable of sufficiently coping with a minute magnetic pattern. Moreover, both faces of the magnetic sensor element 45 are covered by the thin plate-shaped nonmagnetic members 48 and thus, even when the magnetic sensor element 45 is thinly structured, for example, abrasion due to sliding with the medium 1 is prevented and reinforcement of the magnetic sensor element 45 is performed. Further, workability can be improved when the magnetic sensor element 45 is to be manufactured or when the magnetic sensor element 45 is to be mounted on the magnetic pattern detection device 100.

Further, since the presence/absence of the magnetic pattern 2 is detected from the medium 1 while the sensor part 20 and the medium 1 are relatively moved to each other, the magnetic pattern 2 can be efficiently detected over the entire medium 1 in the feeding direction. In addition, the sensor part 20 is disposed at plural positions in a direction intersecting with the feeding direction of the medium 1 and thus the presence/absence and the formed position of the magnetic pattern 2 in a widthwise direction of a carried medium 1 can be efficiently detected. In accordance with an embodiment of the present invention, when the sensor part 20 is disposed at plural positions in a widthwise direction intersecting with the feeding direction of the medium 1, the magnetic field application part 30 may be structured to be divided in the widthwise direction so as to correspond to the magnetic field detecting part 40 in a one-to-one manner, or one piece of the magnetic field application part 30 may be disposed so as to correspond to the plural magnetic field detecting parts in the widthwise direction.

(Other Structures)

In the magnetic sensor element 45 which is used in the embodiment described above, as shown in FIG. 4(a), the first protruded part 411 and the second protruded part 412 of the sensor core 41 are protruded from the center portions of the upper and lower ends of the body part 410 and the bias exciting coil 43 for generating bias magnetic field and the differential exciting coil 44 for generating differential magnetic field are wound around the first protruded part 411 and the second protruded part 412. However, as shown in FIG. 4(d), totaled four third protruded parts 413 may be formed on both sides of the upper and lower ends of the body part 410 so as to interpose the first protruded part 411 and the second protruded part 412 between them. According to this structure, since closed magnetic circuits are formed, magnetic flux passing through the air whose permeability is lower is decreased and thus sensitivity can be improved.

Further, in the embodiment described above, the medium 1 is moved in order that the medium 1 and the sensor part 20 are relatively moved to each other. However, it may be structured that the medium 1 is disposed in a fixed state and the sensor part 20 is moved with respect to the medium 1.

In addition, in the embodiment described above, a permanent magnet is used for the magnetic field application part 30 but an electromagnet may be used.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

The invention claimed is:

1. A magnetic pattern detection device for use with a medium having at least one magnetic pattern of a plurality of types of magnetic patterns whose residual magnetic flux density and permeability are different on a basis of both of a level of residual magnetic flux density and a level of permeability, the magnetic pattern detection device comprising:
a common sensor part structured to detect presence/absence of each of the plurality of types of magnetic patterns; and
a signal processing section structured to extract a first signal corresponding to the level of the residual magnetic flux density and a second signal corresponding to the level of the permeability from a signal outputted from the sensor part;
wherein the common sensor part comprises:
a magnetic field application part structured to apply a magnetic field to the medium; and
a magnetic flux detecting part disposed at a position separated from the magnetic field application part and structured to detect magnetic flux in a state where a bias magnetic field is applied to the medium after the magnetic field by the magnetic field application part has been applied;
wherein the magnetic flux detecting part comprises a magnetic sensor element which includes a sensor core, a bias exciting coil which is wound around the sensor core and structured to generate the bias magnetic field, and a detection coil which is wound around the sensor core, and the magnetic sensor element is accommodated within a magnetic shield case;
wherein the magnetic field application part comprises a permanent magnet which is disposed on a front side in a feeding direction of the medium with respect to the magnetic sensor element accommodated within the magnetic shield case; and
wherein the medium applied with a magnetic field of the permanent magnet is passed through the magnetic flux detecting part and, in the magnetic flux detecting part, the bias magnetic field is applied to the medium by the bias exciting coil and the magnetic flux is detected by the detection coil and thereby the first signal corresponding to the level of the residual magnetic flux density and the second signal corresponding to the level of the permeability are extracted from a signal outputted from the detection coil.

2. The magnetic pattern detection device according to claim 1, wherein the magnetic sensor element includes a differential exciting coil for generating a differential magnetic field which is wound around the sensor core in a reverse direction to the bias exciting coil for generating the bias magnetic field.

3. The magnetic pattern detection device according to claim 1, wherein an alternating current is applied to the bias exciting coil for generating the bias magnetic field.

4. The magnetic pattern detection device according to claim 1, wherein
the signal processing section comprises:
an adding circuit structured to add a peak value and a bottom value of a signal outputted from the magnetic sensor element extract the first signal corresponding to the level of the residual magnetic flux density of the magnetic pattern; and
a subtracting circuit structured to subtract the peak value and the bottom value to extract the second signal corresponding to the level of the permeability of the magnetic pattern.

5. The magnetic pattern detection device according to claim 1, wherein the magnetic pattern is printed by using magnetic ink containing hard material and/or magnetic ink containing soft material.

6. The magnetic pattern detection device according to claim 1, wherein the sensor part is disposed at plural positions in a direction intersecting with a feeding direction of the medium.

7. The magnetic pattern detection device according to claim 1, wherein the signal processing section comprises:
an adding circuit structured to add a peak value and a bottom value of a signal outputted from the magnetic sensor element to extract the first signal corresponding to the level of the residual magnetic flux density of the magnetic pattern; and
a subtracting circuit structured to subtract the peak value and the bottom value to extract the second signal corresponding to the level of the permeability of the magnetic pattern.

8. The magnetic pattern detection device according to claim 1, further comprising a feeding means structured to relatively move the sensor part with respect to the medium.

9. The magnetic pattern detection device according to claim 8, wherein the signal processing section is structured to detect the presence/absence and a formed position of each of the plurality of types of the magnetic patterns in the medium on a basis of the first signal, the second signal and relative positional information between the medium and the sensor part.

10. The magnetic pattern detection device according to claim 1, wherein the sensor core is provided with a body part, around which the detection coil is wound, and a protruded part which is protruded from the body part toward a side where the medium is passed, and the bias exciting coil is wound around the protruded part.

11. The magnetic pattern detection device according to claim 10, wherein a cross-sectional area of the protruded part is smaller than a cross-sectional area of the body part.

12. The magnetic pattern detection device according to claim 1, wherein the sensor core is formed in a thin plate shape.

13. The magnetic pattern detection device according to claim 12, wherein both faces of the magnetic sensor element are covered with nonmagnetic members.

* * * * *